(12) United States Patent
Maner

(10) Patent No.: US 8,434,169 B2
(45) Date of Patent: May 7, 2013

(54) GARMENT HAVING AN ELECTROMAGNETIC FIELD PROTECTIVE LAYER

(76) Inventor: William Lawrence Maner, Phoenix, AZ (US)

( * ) Notice: Subject to any disclaimer, the term of this patent is extended or adjusted under 35 U.S.C. 154(b) by 253 days.

(21) Appl. No.: 12/577,085

(22) Filed: Oct. 9, 2009

(65) Prior Publication Data

US 2010/0186155 A1     Jul. 29, 2010

Related U.S. Application Data

(60) Provisional application No. 61/206,046, filed on Jan. 27, 2009, provisional application No. 61/214,706, filed on Apr. 25, 2009.

(51) Int. Cl.
    *A41D 13/00*       (2006.01)

(52) U.S. Cl.
    USPC ............................... 2/457; 2/69; 174/124 R

(58) Field of Classification Search ............... 2/466, 115, 2/102, 108, 73, 71, 79, 69, 400, 401, 406; 174/388, 350, 353, 357, 391, 392, 393; 450/153
See application file for complete search history.

(56) References Cited

U.S. PATENT DOCUMENTS

| | | | | |
|---|---|---|---|---|
| 3,310,053 A | * | 3/1967 | Greenwood | 450/153 |
| 5,073,984 A | * | 12/1991 | Tone et al. | 2/457 |
| 5,103,504 A | * | 4/1992 | Dordevic | 2/243.1 |
| 5,115,140 A | | 5/1992 | Rodriguez | |
| 5,621,188 A | * | 4/1997 | Lee et al. | 174/390 |
| 6,665,877 B1 | * | 12/2003 | Gray | 2/69 |

* cited by examiner

*Primary Examiner* — Khoa Huynh
*Assistant Examiner* — Khaled Annis
(74) *Attorney, Agent, or Firm* — Parsons & Goltry; Robert A. Parsons; Michael W. Goltry

(57) ABSTRACT

A shielding or protective garment in the form of women's clothing includes an outer fashionable portion or component and an inner protective portion or component having electromagnetic radiation defeating material distributed throughout the inner component. The inner component is affixed within the outer component as a liner so as to extend around and over a portion of a wearer's torso and lower abdomen. The electromagnetic radiation defeating material of the inner component shields or protects the wearer from electromagnetic fields coming from any or all directions.

15 Claims, 4 Drawing Sheets

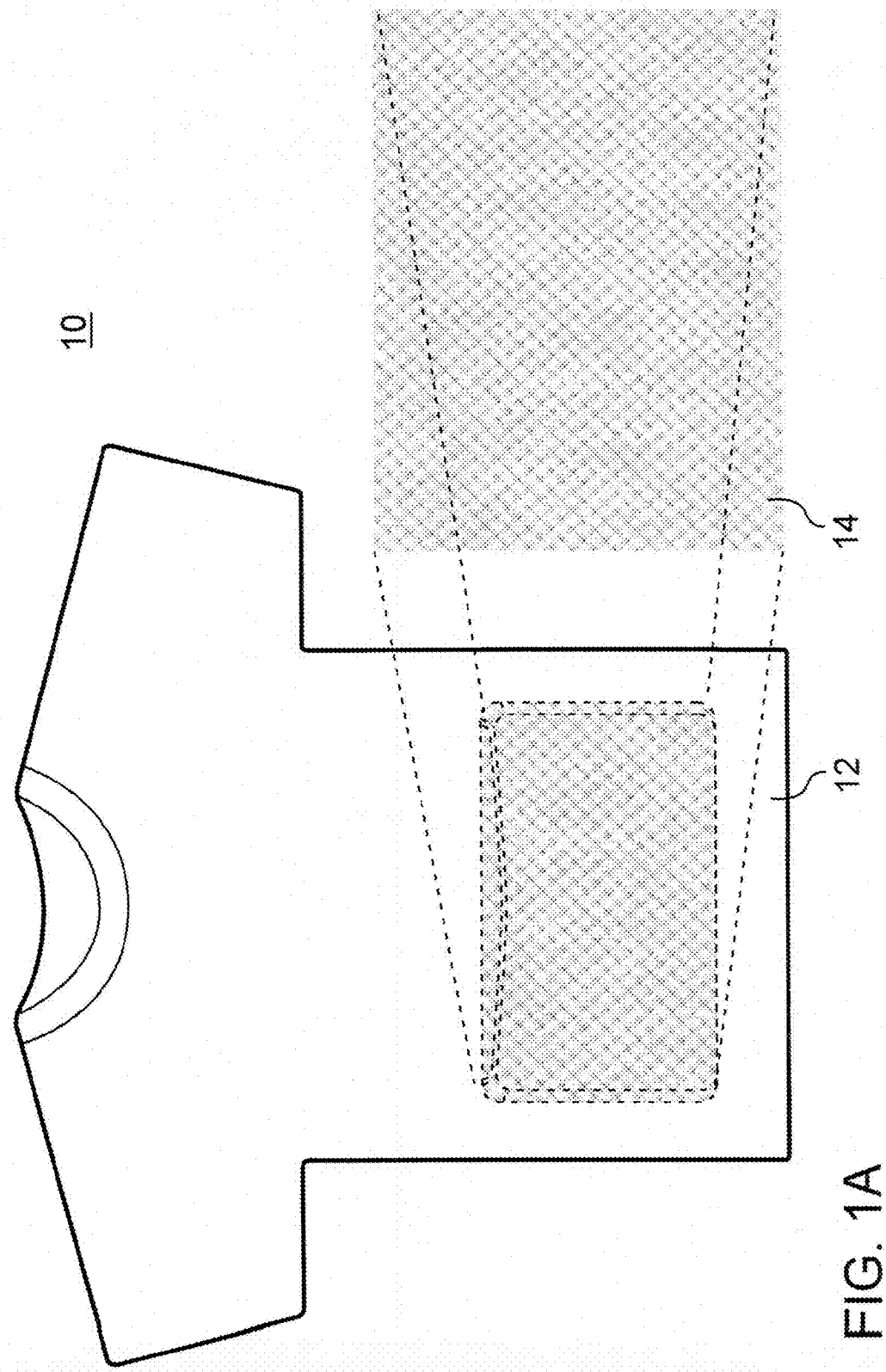

26

30

GARMENT HAVING AN ELECTROMAGNETIC FIELD PROTECTIVE LAYER

CROSS-REFERENCE TO RELATED APPLICATIONS

This application claims the benefit of U.S. Provisional Applications No. 61/206,046, filed 27 Jan. 2009 and No. 61/214,706 filed 25 Apr. 2009.

FIELD OF THE INVENTION

This invention relates to shielding or protective garments for protecting women from electromagnetic fields and more specifically for protecting and/or reducing exposure of reproductive organs and fetuses of women to electromagnetic fields.

BACKGROUND OF THE INVENTION

Electric, magnetic, and electromagnetic fields, rays, radiation, force, waves, particles, and wave particles, hereinafter referred to generically as "electromagnetic fields" or "electromagnetism", surround us in everyday life. The strength of these electromagnetic fields can be described and measured as their intensity, amplitude, energy, energy density, power, strength, force, flux, presence and/or number of electromagnetic fields. The effect of these phenomena increase in intensity as our exposure increases to, among other sources, inside-home power lines, outside overhead and buried power lines, household appliances, televisions, computers, electric heating elements (e.g. electric blankets and the like), industrial electric motors, subways, cell-phones, medical devices, and even those emanating from violent splar flares. As a result, exposure of the reproductive tract, systems, tissues, organs, fetuses, and other living entities in pregnant or non-pregnant women to these fields also increases. A number of studies in both animals and in humans indicate that there are adverse effects on the reproductive system, tract, organs, tissues, or other living entities in women associated with these electromagnetic radiations. See for example: St-Pierre L S, Persinger M A. Percept Mot Skills. Conspicuous histomorphological anomalies in the hippocampal formation of rats exposed prenatally to a complex sequenced magnetic field within the nano Tesla range. 2003 December; 97 (3Pt2), 1307-14; Okudan B. et al. DEXAAnylsis on the Bones of Rats Exposed in Utero and Neonatally to Static and 50 Hz Electric Fields. Bioelectromagnetics. 2006: 27:589-592; Shumilov Ol, Kasatkina E A, Enikeev A V, Khramov A A. [The study of effects of geomagnetic disturbances at high latitudes on the intrauterine condition of fetus by cardiotocography]. Biofizika. 2003 March-April, 48(2):374-9.

Such adverse outcomes on the fetus are often the result of a direct effect of electric fields on cellular membranes, termed "electroporation". Electroporation is the process whereby electric fields produce changes in cellular membranes that result in the formation of pores through which charged ions or large molecules may pass. Typically, the lipid bilayer component of cellular membranes is highly hydrophobic and has a low dielectric constant so that it is extremely difficult for charged ions to pass through an intact membrane. Thus, in most cells the movement of ions occurs through channels created by specific transmembrane proteins. However, in the presence of electromagnetism or electromagnetic radiation, temporary openings develop in bilayer membranes allowing ions and large molecules to pass easily through the membrane (Gowrishankar T R, Weaver J C. An approach to electrical modeling of single and multiple cells. Proc Natl Acad Sci U S A. 2003 Mar. 18; 100(6):3203-8. Tieleman D P. The molecular basis of electroporation.BMC Biochem. 2004 Jul. 19; 5:10.). Electromagnetism can also cause direct injury to fetal tissue through electroconformational denaturation of cellular proteins (Chen W. Electroconformational denaturation of membrane proteins. Ann N Y Acad Sci. 2005 December; 1066:92-105. Review.). Since many protiens contain charged groups, their structure can be significantly affected by external electromagnetism. In particular, permanent changes in conformation may occur even after the transient exposure to such electromagnetism. This renders the protein useless and causes subsequent cell damage.

There are a large number of patents and other publications in the protection art that describe various articles and methods to provide protection for a variety of problems. In many of these prior art concepts, some form of substantially solid metal insert is used to protect a portion of the human body from electricity in a specific direction, generally from the front (see for example U.S. Pat. Nos. 5,247,182, 5,621,188, and 5,690,537). In some concepts, rather than solid metal inserts, conductive fibers are woven into a fabric to form the protective apparel, such as the apparel described in U.S. Pat. No. 4,684,762. In other concepts, the surface of a material is metalized or coated (electroless deposition) with an electrical conductor to provide an electrical path for electricity (see for example U.S. Pats. No. 5,073,984, and 5,115,140). Many clothing articles and fabrics have been devised to protect the human body from fire, such as the apparel described in U.S. Pat. No. 7,156,883. There have even been garments devised to protect humans against electrostatic fields or the build-up of electrostatic charges by the body movement, such as the apparel described in U.S. Pat. No. 6,665,877.

Each of these prior art concepts has a specific unfavorable characteristic that makes the fabric or apparel unpopular or impractical to use. For example, the solid metal inserts and coated fabrics are very cumbersome and uncomfortable to wear. Further, many of the various types of prior art apparel simply cover or protect a single part of the body or protect a portion of the body from exposure coming from a single direction. Many, if not all, of the prior art apparel are not aesthetically appealing and therefore unfashionable and unpopular.

It would be highly advantageous, therefore, to remedy the foregoing and other deficiencies inherent in the prior art.

Accordingly, it is an object of the present invention to provide new and improved shielding or protective garments specific for protecting women from electromagnetic fields.

Another object of the present invention is to provide new and improved shielding or protective garments that are aesthetically appealing and therefore fashionable and could be worn in day to day activities.

Another object of the present invention is to provide new and improved shielding or protective garments that protect all or substantially all of the body or torso and lower abdomen from electromagnetic fields coming from any or all directions.

SUMMARY OF THE INVENTION

Briefly, to achieve the desired objects of the instant invention in accordance with a preferred embodiment thereof, a shielding or protective garment in the form of women's clothing is provided. The garment includes an outer fashionable portion or component and an inner protective portion or component, with the inner component having electromagnetic radiation defeating elements distributed throughout. The inner component is affixed within the outer component substantially as a liner so as to extend around and over a portion of a wearer's torso and lower abdomen. The electromagnetic radiation defeating elements of the inner component shields or protects the wearer from electromagnetic fields coming from any or all directions.

A specific method of shielding women from electromagnetic fields includes the step of providing a garment including an outer fashionable portion or component in the form of women's clothing, and an inner protective portion or component including electromagnetic radiation defeating elements distributed throughout the inner protective portion or component, the inner protective portion or component affixed within the outer fashionable portion substantially as a generally cylindrically shaped liner. The method also includes the step of positioning the garment on a woman with the generally cylindrical inner protective portion or component extending around and over a substantial portion of the woman's torso and lower abdomen to protect the entire female reproductive tract of the woman as well as an unborn fetus within the woman, from electromagnetic fields coming from any or all directions.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 1A is a simplified view of a protective garment, including first and second portions, in accordance with the present invention;

DETAILED DESCRIPTION OF DRAWINGS

Turning now to FIG. 1A, a simplified garment 10 is illustrated that includes a first or fashionable portion or component 12 and a second or protective portion or component 14 in accordance with the present invention. Garment 10 and specifically component 12 are illustrated in simplified form so as to be representative of any garment, such as a dress, long waist, smock, blouse or other type of clothing traditionally worn by women and especially pregnant women (hereinafter defined as "women's clothing"). It should also be understood that because of the material used and the specific and novel construction, component 12 can be representative of dress clothing, fashionable clothing, or even formal wear, and could be comfortably worn in daily activities and environments.

Protective portion or component 14 is designed to fit within component 12 and to extend completely around a women's body or torso and lower abdomen, i.e. component 14 is generally cylindrical in shape. Primarily, component 14 is formed to protect the entire female reproductive tract (e.g. vagina, cervix, ovaries, etc.) as well as an unborn fetus within the wearer, from electromagnetic fields coming from any or all directions. Further, component 14 is formed to be affixed to and within component 12 by any convenient means, such as sewn, zipper, buttons, Velcro, or other type of affixing apparatus or method. Generally, the fabric from which component 14 is formed (see information below) is light and flexible so as to provide the perception or feeling of a normal lining within component 12. Also, when joined together to form garment 10, components 12 and 14 are designed to conform to the shape of the changing female body during non-pregnancy and all the way through late pregnancy.

Figure 1B:
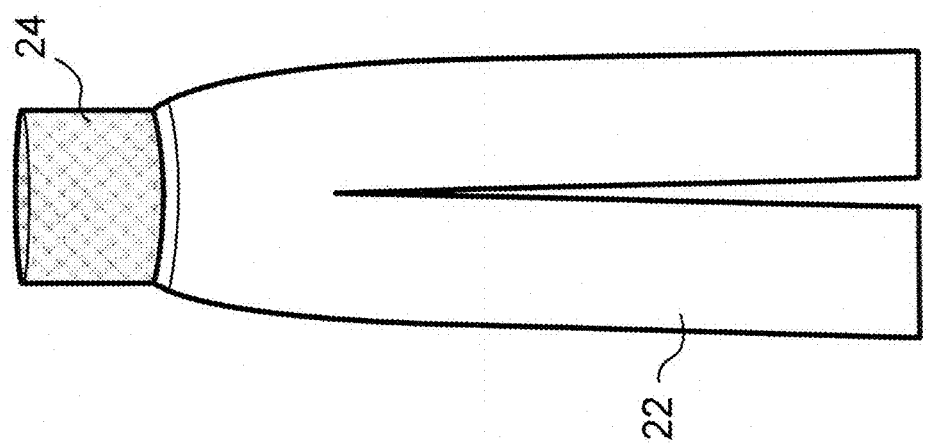
FIG. 1B is another simplified view of a protective garment, including first and second portions, in accordance with the present invention.

Turning now to FIG. 1B, another embodiment of a simplified garment 20 is illustrated. In this embodiment, garment 20 includes a first or fashionable portion or component 22 and a second or protective portion or component 24 in accordance with the present invention. Garment 20 and specifically component 22 are illustrated in simplified form so as to be representative of any garment, such as pants, shorts, skirts, or other type of clothing traditionally worn by women and especially pregnant women (hereinafter defined as "women's clothing"). It should also be understood that because of the material used and the specific and novel construction, component 22 can be representative of dress clothing, fashionable clothing, or even formal wear, and could be comfortably worn in daily activities and environments.

Protective portion or component 24 is designed to fit within component 22 and to extend up over and completely around a women's body or torso and lower abdomen, i.e. component 24 is generally cylindrical in shape. Primarily, component 24 is formed to protect the entire female reproductive tract (e.g. vagina, cervix, ovaries, etc.) as well as an unborn fetus within the wearer, from electromagnetic fields coming from any or all directions. Further, component 24 is formed to be affixed to and within component 22 by any convenient means, such as sewn, zipper, buttons, Velcro, or other type of affixing apparatus or method. Generally, the fabric from which component 24 is formed (see information below) is light and flexible so as to provide the perception or feeling of a normal lining within component 22. Also, when joined together to form garment 20, components 22 and 24 are designed to conform to the shape of the changing female body during non-pregnancy and all the way through late pregnancy.

Figure 2:
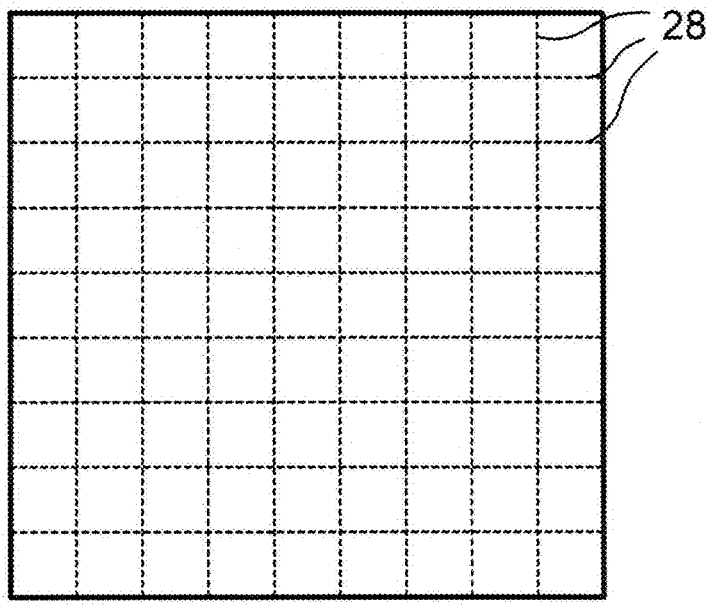
FIG. 2 is a simplified view illustrating one type of protective material for use in fabricating the second portion of the garment illustrated in FIGS. 1A and 1B.

Referring additionally to FIG. 2, an example of a specific fabric 26 is illustrated for use in fabricating protective portion or component 14 and 24. In a preferrable formation, fabric 26 is a cotton woven material with impregnated "flakes" 28 of electromagnetic radiation defeating elements. It will be understood that the term "flakes" includes substantially any type of particles or strands, such as "specks," or "grains", and the like. Additionally, the term "electromagnetic radiation defeating element" is intended to encompass metallic or other electrically or electromagnetically conductive or reflective material positioned in a grid-like or mesh-like pattern. While cotton is the preferred basic material, it should be understood that any soft, pliable material could be used, such as wool material, silk material, fur material, leather material, down material, Ingeo material, plant-fiber material, Lycra material, Rayon material, Acetate material, Nylon material, Modacrylic material, Olefin material, Acrylic material, Polyester material, Polylactide material, Vinyon material, Saran material, Spandex material, Aramid material, PBI material, Sulfar material, Lyocell material, Acrylonitrile rubber material, plastic material, and/or polyester material, and composites thereof, etc. In FIG. 2, each dash in the horizontal and vertical lines of the grid represents an electromagnetic radiation defeating element or flake 28 (thus including metallic or other electrically or electromagnetically conductive or reflective material flake, speck, strand or grain). The spacing of the horizontal and vertical lines of the grid or mesh must be sufficiently small (i.e. narrow) to stop, reduce, absorb, or reflect electromagnetic fields or electromagnetism directed toward the wearer. Generally, the electromagnetism will be at typical frequencies of cellphones, microwaves, power lines, household appliances, etc. In the specific example represented by fabric 26, individual flakes 28 are separate and do not touch adjacent flakes 28 so that each flake 28 operates to stop, reduce, absorb, or reflect electromagnetic fields or electromagnetism in addition to cooperating with adjacent flakes 28 to perform the same function. It is believed that the combination of individual flakes 28 operating alone and in cooperation with adjacent flakes 28 substantially broadens the wavelength of electromagnetism affected by fabric 26. While fabric 26 is illustrated with horizontal and vertical lines forming a grid or mesh with square openings for convenience of understanding, it should be understood that the grid or mesh could be formed to define any desired openings including triangles, pentagons, or even non-symmetric or random shapes.

Figure 3:
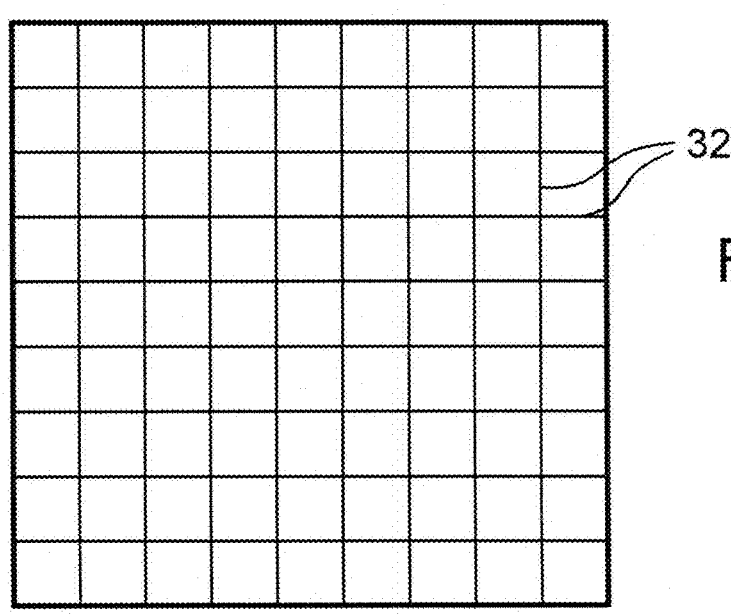
FIG. 3 is a simplified view illustrating another type of protective material for use in fabricating the second portion of the garment illustrated in FIGS. 1A and 1B.
Figure 4:
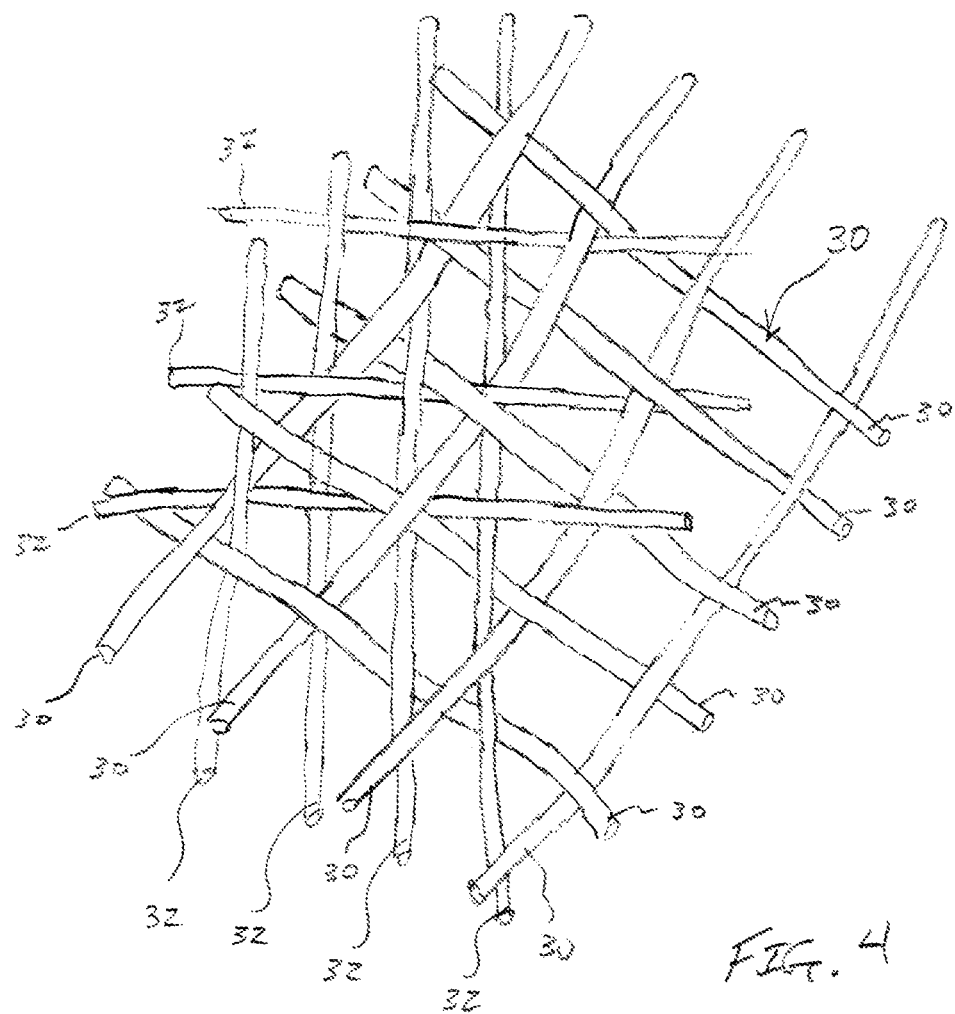
FIG. 4 is an enlarged sectional view of the protective material of FIG. 3.

Referring additionally to FIGS. 3 and 4, an example of a specific fabric 30 is illustrated for use in fabricating protective portion or component 14 and 24. In a preferrable formation, the basic material of fabric 30 is any soft, pliable material, such as cotton, silk, polyester, etc. In this specific formation, very thin electromagnetic radiation defeating wires 32 are woven or knitted into the surrounding basic material in a grid-like or mesh-like pattern. As illustrated in FIG. 4 the electromagnetic radiation defeating material pattern is designed with a pattern that is discrete from and completely distinct of the basic material textile pattern when the electromagnetic radiation defeating material pattern and the basic material textile pattern are woven or knitted into each other. As stated previously, it will be understood that the term "electromagnetic radiation defeating wires" is intended to encompass metallic or other electrically or electromagnetically conductive or reflective material. Generally, wires 32 will include some highly conductive metal, such as silver, copper, gold, aluminum, iron, steel, brass, bronze, nickel, zinc, tungsten, platinum, molybdenum, chromium, titanium, manganese, graphite and other carbon-based compounds, polymers, ceramics, plastics, and alloys or composites thereof, etc. The spacing of the horizontal and vertical wires 32 of the grid or mesh must be sufficiently small (i.e. narrow) to stop, reduce, absorb, or reflect electromagnetic fields or electromagnetism directed toward the wearer. Generally, the electromagnetism will be at typical frequencies of cellphones, microwaves, power lines, household appliances, etc.

In a slightly different or alternative approach, fabric 30 can be completely composed of conducting wires, i.e. the spacing between adjacent horizontal wires 32 and between adjacent vertical wires 32 is reduced to a minimum and the basic material is eliminated. Each wire 32 of the grid or mesh may be coated with an insulating material or not, depending upon the specific construction of fabric 30.

In another slightly different or alternative approach, fabric 30 can be made so as to include cotton or other standard threaded material which has been coated with an electromagnetic radiation defeating material such as silver, copper, gold, aluminum, iron, steel, brass, bronze, nickel, zinc, tungsten, platinum, molybdenum, chromium, titanium, manganese, graphite and other carbon-based compounds, polymers, ceramics, plastics, and alloys or composites thereof. As an example, fabric 30 can be formed from cotton threads sprayed with a silver solution. In this approach, fabric 30 can include a grid or mesh of such coated threads or can be made entirely of the coated threads.

Because of the soft and pliable nature of the described materials, protective portion or component 14 and/or 24 can be fabricated to fit comfortably within component 12 and/or 22 and to extend completely around a women's body. Also, because protective portion or component 14 and/or 24 functions substantially like a lining in component 12 and/or 22, garment 10 and/or 20 can be designed aesthetically appealing and fashionable. Further, because protective portion or component 14 and/or 24 functions substantially like a lining in component 12 and/or 22, it can be formed to substantially surround the wearer's body to provide maximum protection from electromagnetism coming from any or all directions and at all times.

Thus, new and improved shielding or protective garments for protecting women from electromagnetic fields have been disclosed. The new and improved shielding or protective garments are aesthetically appealing and therefore fashionable. Also, the new and improved shielding or protective garments protect all or substantially all of the wearer's body from any or all directions.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A shielding or protective garment in the form of women's clothing, the garment comprising:
   an outer fashionable portion or component;
   an inner protective portion or component including a basic material having a textile pattern and an electromagnetic radiation defeating material distributed in a grid-like or mesh-like pattern of lines supported by the basic material throughout the portion or component, the electromagnetic radiation defeating material forming the grid-like or mesh-like pattern of lines being designed with a pattern that is discrete from and completely distinct of the basic material textile pattern when the electromagnetic radiation defeating material pattern and the basic material textile pattern are woven or knitted into each other, the inner protective portion or component affixed within the outer fashionable portion substantially as a liner so as to extend around and over a substantial portion of a wearer's torso and lower abdomen; and
   the electromagnetic radiation defeating material of the inner protective portion or component shielding or protecting the wearer from electromagnetic fields coming from any or all directions.

2. A shielding or protective garment as claimed in claim 1 wherein the inner protective portion or component is generally cylindrical.

3. A shielding or protective garment as claimed in claim 2 wherein the generally cylindrical inner protective portion or component is formed to protect the entire female reproductive tract of the wearer as well as an unborn fetus within the wearer, from electromagnetic fields coming from any or all directions.

4. A shielding or protective garment as claimed in claim 1 wherein the inner protective portion or component is affixed within the outer fashionable portion by one of sewing, weaving, stitching, fastening, buttoning, zipping, knitting, gluing, tying, and Velcro.

5. A shielding or protective garment as claimed in claim 1 wherein the distributed electromagnetic radiation defeating material of the inner protective portion or component includes the grid-like or mesh-like pattern of lines being formed of one of flakes of electromagnetic radiation defeating material, electromagnetic radiation defeating wires, electromagnetic radiation defeating threads, and electromagnetic radiation defeating material coated threads.

6. A shielding or protective garment as claimed in claim 5 wherein a distance between adjacent lines of the grid or mesh is specifically tailored to stop, reduce, absorb, or reflect electromagnetic fields, and the intensity, amplitude, energy, energy density, power, strength, force, flux, presence and/or number thereof independent of the basic material.

7. A shielding or protective garment as claimed in claim 1 wherein the distributed electromagnetic radiation defeating material includes one of silver, copper, gold, aluminum, iron, steel, brass, bronze, nickel, zinc, tungsten, platinum, molybdenum, chromium, titanium, manganese, graphite and other carbon-based compounds, polymers, ceramics, plastics, and alloys and composites thereof.

8. A shielding or protective garment as claimed in claim 1 wherein the basic material includes one of cotton material, wool material, silk material, fur material, leather material, down material, Ingeo material, plant-fiber material, Lycra material, Rayon material, Acetate material, Nylon material, Modacrylic material, Olefin material, Acrylic material, Polyester material, Polylactide material, Vinyon material, Saran material, Spandex material, Aramid material, PBI material, Sulfar material, Lyocell material, Acrylonitrile rubber material, plastic material, and/or polyester material, and composites thereof.

9. A shielding or protective garment for women comprising:
an outer fashionable portion or component in the form of women's clothing;
an inner protective portion or component including a soft, pliable basic material having a textile pattern, and an electromagnetic radiation defeating material being one of flakes of electromagnetic radiation defeating material, electromagnetic radiation defeating wires, electromagnetic radiation defeating threads, and electromagnetic radiation defeating material coated threads, distributed in a grid-like or mesh-like pattern of lines within and supported by the basic material throughout the inner protective portion or component, the electromagnetic radiation defeating material forming the grid-like or mesh-like pattern of lines being designed with a pattern that is discrete from and completely distinct of the basic material textile pattern when the electromagnetic radiation defeating material pattern and the basic material textile pattern are woven or knitted into each other, the inner protective portion or component affixed within the outer fashionable portion substantially as a generally cylindrically shaped liner; and
the generally cylindrical inner protective portion or component being formed to extend around and over a substantial portion of a wearer's torso and lower abdomen so as to protect the entire female reproductive tract of the wearer as well as an unborn fetus within the wearer, from electromagnetic fields coming from any or all directions.

10. A shielding or protective garment as claimed in claim 9 wherein the inner protective portion or component is affixed within the outer fashionable portion by one of sewing, weaving, stitching, fastening, buttoning, zipping, knitting, gluing, tying, or Velcro.

11. A shielding or protective garment as claimed in claim 9 wherein a distance between adjacent lines of the grid or, mesh is specifically tailored to stop, reduce, absorb, or reflect electromagnetic fields, and the intensity, amplitude, energy, energy density, power, strength, force, flux, presence and/or number thereof independent of the basic material.

12. A shielding or protective garment as claimed in claim 9 wherein the distributed electromagnetic radiation defeating material includes one of silver, copper, gold, aluminum, iron, steel, brass, bronze, nickel, zinc, tungsten, platinum, molybdenum, chromium, titanium, manganese, graphite and other carbon-based compounds, polymers, ceramics, plastics, and alloys and composites thereof.

13. A shielding or protective garment as claimed in claim 9 wherein the soft, pliable basic material includes one of cotton material, wool material, silk material, fur material, leather material, down material, Ingeo material, plant-fiber material, Lycra material, Rayon material, Acetate material, Nylon material, Modacrylic material, Olefin material, Acrylic material, Polyester material, Polylactide material, Vinyon material, Saran material, Spandex material, Aramid material, PBI material, Sulfar material, Lyocell material, Acrylonitrile rubber material, plastic material, and/or polyester material, and composites thereof.

14. A method of shielding women from electromagnetic fields comprising:
providing a garment including an outer fashionable portion or component in the form of women's clothing, and an inner protective portion or component including a soft, pliable basic material having a textile pattern, and an electromagnetic radiation defeating material being one of flakes of electromagnetic radiation defeating material, electromagnetic radiation defeating wires, electromagnetic radiation defeating threads, and electromagnetic radiation defeating material coated threads, distributed in a grid-like or mesh-like pattern of lines within and supported by the basic material throughout the inner protective portion or component, the electromagnetic radiation defeating material forming the grid-like or mesh-like pattern of lines being designed with a pattern that is discrete from and completely distinct of the basic material textile pattern when the electromagnetic radiation defeating material pattern and the basic material textile pattern are woven or knitted into each other, the inner protective portion or component affixed within the outer fashionable portion substantially as a generally cylindrically shaped liner; and
positioning the garment on a woman with the generally cylindrical inner protective portion or component extending around and over a substantial portion of the woman's torso and lower abdomen to protect the entire female reproductive tract of the woman as well as an unborn fetus within the woman, from electromagnetic fields coming from any or all directions.

15. A method as claimed in claim 14 wherein the step of providing the garment with the inner protective portion or component including electromagnetic radiation defeating material distributed throughout includes the step of providing the grid or mesh pattern of lines with a distance between adjacent lines of the grid or mesh being specifically tailored to stop, reduce, absorb, or reflect electromagnetic fields.

* * * * *